(12) United States Patent
Dadash Zadeh et al.

(10) Patent No.: US 9,276,396 B2
(45) Date of Patent: Mar. 1, 2016

(54) POWER TRANSMISSION FAULT ANALYSIS SYSTEM AND RELATED METHOD

(75) Inventors: Mohammad Reza Dadash Zadeh, London (CA); Ilia Voloh, Thornhill (CA); Mitalkumar Gulabrai Kanabar, Toronto (CA)

(73) Assignee: General Electric Company, Schenectady, NY (US)

( * ) Notice: Subject to any disclaimer, the term of this patent is extended or adjusted under 35 U.S.C. 154(b) by 898 days.

(21) Appl. No.: 13/399,039

(22) Filed: Feb. 17, 2012

(65) Prior Publication Data

US 2013/0218359 A1 Aug. 22, 2013

(51) Int. Cl.

| | | |
|---|---|---|
| G05D 3/12 | (2006.01) | |
| G05D 5/00 | (2006.01) | |
| G05D 9/00 | (2006.01) | |
| G05D 11/00 | (2006.01) | |
| G05D 17/00 | (2006.01) | |
| G01R 31/02 | (2006.01) | |
| H04B 3/46 | (2015.01) | |
| H02H 3/06 | (2006.01) | |
| G01R 31/08 | (2006.01) | |
| H01H 83/20 | (2006.01) | |

(52) U.S. Cl.
CPC .............. *H02H 3/063* (2013.01); *G01R 31/085* (2013.01); *G01R 31/088* (2013.01); *H01H 2083/201* (2013.01)

(58) Field of Classification Search
CPC ............. H02H 3/063; H01H 2083/201; G01R 31/085; G01R 31/088
USPC .......................... 700/286, 294–294, 294–296; 324/543–544
See application file for complete search history.

(56) References Cited

U.S. PATENT DOCUMENTS

| | | | | |
|---|---|---|---|---|
| 4,367,507 A | * | 1/1983 | Shperling et al. | 361/43 |
| 4,477,855 A | * | 10/1984 | Nakayama et al. | 361/54 |
| 5,543,995 A | * | 8/1996 | Kumagai et al. | 361/65 |
| 5,805,400 A | | 9/1998 | Kim | |
| 5,854,730 A | * | 12/1998 | Mitchell et al. | 361/38 |

(Continued)

FOREIGN PATENT DOCUMENTS

| | | |
|---|---|---|
| CN | 101247040 A | 8/2008 |
| CN | 101359822 A | 2/2009 |
| GB | 2390768 A | 7/2002 |

OTHER PUBLICATIONS

An Adaptive HV Transmission Lines Reclosing based on Voltage Pattern in the Complex Plane; Zadeh et al., copyright 2011; 11 pages.*

Kasztenny et al., "Enhanced Numerical Breaker Failure Protection," 2008, pp. 1838-1845, IEEE Transactions on Power Delivery, vol. 23, No. 4.

Kariya et al., Chapter 5 of the book "Generalized Least Square," 2004, pp. 59-64.

(Continued)

*Primary Examiner* — Ronald Hartman, Jr.
(74) *Attorney, Agent, or Firm* — Sutherland Asbill & Brennan LLP

(57) ABSTRACT

Systems configured to analyze and/or respond to faults detected during the operation of a power transmission system are disclosed. In one embodiment, a system includes at least one computing device adapted to monitor operation of a power transmission system by performing actions comprising processing operational data from a set of line phases in the power transmission system to detect a faulted line phase; opening a circuit breaker for the faulted line phase in response to detecting the fault; determining whether the fault is transient or permanent; and determining if an arc associated with the fault has been extinguished.

17 Claims, 7 Drawing Sheets

(56) References Cited

U.S. PATENT DOCUMENTS

| | | | |
|---|---|---|---|
| 6,259,996 B1 | 7/2001 | Haun et al. | |
| 6,667,691 B2* | 12/2003 | Sapir | 340/635 |
| 6,703,842 B2* | 3/2004 | Itimura | G01R 31/025 324/536 |
| 6,718,271 B1* | 4/2004 | Tobin | G01R 31/024 324/521 |
| 6,720,872 B1* | 4/2004 | Engel et al. | 340/514 |
| 6,768,620 B2 | 7/2004 | Kim et al. | |
| 6,882,137 B1 | 4/2005 | Voisine | |
| 7,626,397 B2* | 12/2009 | Opfer et al. | 324/509 |
| 8,000,069 B2* | 8/2011 | Montenegro et al. | 361/71 |
| 8,125,751 B2* | 2/2012 | Cavanna et al. | 361/93.2 |
| 8,213,138 B2* | 7/2012 | Dougherty | 361/42 |
| 8,284,529 B2* | 10/2012 | Kim et al. | 361/19 |
| 8,680,873 B2* | 3/2014 | Yang et al. | 324/543 |
| 8,681,462 B2* | 3/2014 | O'Leary et al. | 361/71 |
| 2002/0149891 A1* | 10/2002 | Neiger et al. | 361/42 |
| 2003/0030448 A1* | 2/2003 | Sapir | 324/536 |
| 2003/0184931 A1* | 10/2003 | Morris | H02H 11/005 361/42 |
| 2004/0027747 A1 | 2/2004 | Kim et al. | |
| 2011/0148430 A1* | 6/2011 | Yang et al. | 324/543 |
| 2012/0049995 A1* | 3/2012 | Murray | 337/2 |
| 2012/0077527 A1* | 3/2012 | Santiago | G05B 23/0224 455/466 |
| 2012/0095707 A1* | 4/2012 | Li et al. | 702/58 |

OTHER PUBLICATIONS

Montanari et al., "Adaptative Single-Phase Autoreclosing Based on Secondary Arc Voltage Harmonic Signature," 2009, 6 pages, International Conference on Power Systems Transients in Kyoto, Japan.

Bin et al., "The Scheme of Single-Phase Adaptive Reclosing on EHV/UHV Transmission Lines," 2008, pp. 116-120, IET 9th International Conference on Developments in Power System Protection (DPSP).

Radojevic et al., "New Digital Algorithm for Adaptive Reclosing Based on the Calculation of the Faulted Phase Voltage Total Harmonic Distortion Factor," 2007, pp. 37-41, IEEE Transactions on Power Delivery, vol. 22, No. 1.

Jamali et al., "New approach to adaptive single pole auto-reclosing of power transmission lines," 2010, pp. 115-122, IET Generation, Transmission & Distribution, vol. 4, No. 1.

Shperling et al., "Single-Phase Switching Parameters for Untransposed EHV Transmission Lines," 1979, pp. 643-654, IEEE Transactions on Power Apparatus and Systems, vol. PAS-98, No. 2.

Ahn et al., "An Alternative Approach to Adaptive Single Pole Auto-Reclosing in High Voltage Transmission Systems Based on Variable Dead Time Control," 2001, pp. 676-686, IEEE Transactions on Power Apparatus and Systems, vol. 16, No. 4.

Esztergalyos et al., "Single Phase Tripping and Auto Reclosing of Transmission Lines," 1992, pp. 182-192, Transactions on Power Delivery, vol. 17, No. 1.

* cited by examiner

POWER TRANSMISSION FAULT ANALYSIS SYSTEM AND RELATED METHOD

BACKGROUND OF THE INVENTION

The subject matter disclosed herein relates to power transmission systems and, more particularly, to systems for analyzing and/or responding to faults in a power transmission system.

Power transmission systems are generally used to transmit power from generation plants to a set of power consumption locations (e.g., homes, commercial buildings, businesses, etc.). These power transmission systems include a variety of components (e.g., transmission lines, high voltage transmission lines, extra high voltage transmission lines, ultra high voltage transmission lines, cables, transformers, conductors, etc.), which are used to convey power over the distances between the generation plants and the power consumption locations. Some power transmission systems employ a three phase system which may require less conductor material to transmit electric power as compared to single-phase, double-phase, or direct-current systems at the same voltage. During operation, faults may develop within the three phase system as a result of any number of conditions (e.g., a tree falling on a component, a lightning strike, a bird shorting a component, etc.), leading to arcing events and/or disruptions of service. These faults may be transient (e.g., self-extinguishing) or permanent (e.g., requiring technician assistance to correct the fault), and may be single phase, double phase or triple phase.

In these three phase systems, transient faults are the most common form of fault. The short circuit arc of a transient fault is usually self-extinguishing after the opening of a set of line circuit breakers. Thus, some power transmission systems include protection relays using fixed time interval reclosure methods to automatically detect and treat transient faults within the system. In response to a detected fault, these systems open line circuit breakers for the phase(s) which is faulted, and these circuit breakers remain open for a predetermined time period so that the arc extinguishes. After the fixed time interval has passed, the line circuit breakers are reclosed and flow of service is restored. However, in some cases, the pre-set time interval may be longer than necessary to extinguish the arc, resulting in a longer than necessary interruption of service. In yet some other cases, the selected time interval may not be long enough to fully deionize the fault path and, when the line circuit breakers are reclosed, the arc restrikes. Thus, the use of these fixed time interval systems may lead to inefficient operation, arc restriking, system stress, improper power outages, and equipment damage.

BRIEF DESCRIPTION OF THE INVENTION

Systems and methods for analyzing faults in a power transmission system are disclosed. In one embodiment, a system includes at least one computing device adapted to monitor operation of a power transmission system by performing actions comprising processing operational data from a set of line phases in the power transmission system to detect a faulted line phase; opening a circuit breaker for the faulted line phase in response to detecting the fault; determining whether the fault is transient or permanent; and determining if an arc associated with the fault has been extinguished.

A first aspect of the invention provides a system including at least one computing device adapted to monitor operation of a power transmission system by performing actions comprising processing operational data from a set of line phases in the power transmission system to detect a faulted line phase; opening a circuit breaker for the faulted line phase in response to detecting the fault; determining whether the fault is transient or permanent; and determining if an arc associated with the fault has been extinguished.

A second aspect of the invention provides a method including processing operational data from a set of line phases in a power transmission system to detect a fault; opening a circuit breaker in a faulted line phase in response to detection of the fault; determining whether the detected fault is transient or permanent based on the processing of the operational data; and determining if an arc associated with the fault has been extinguished based on the processing of the operational data.

A third aspect of the invention provides a power transmission system including a power generation plant; a set of transmission lines operatively connected to the power generation plant and adapted to transmit electricity via a set of line phases; and at least one computing device adapted to monitor operation of the power transmission system by performing actions comprising processing operational data from the set of line phases in the power transmission system to detect a faulted line phase; opening a circuit breaker for the faulted line phase in response to detecting the fault; determining whether the fault is transient or permanent; and determining if an arc associated with the fault has been extinguished.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
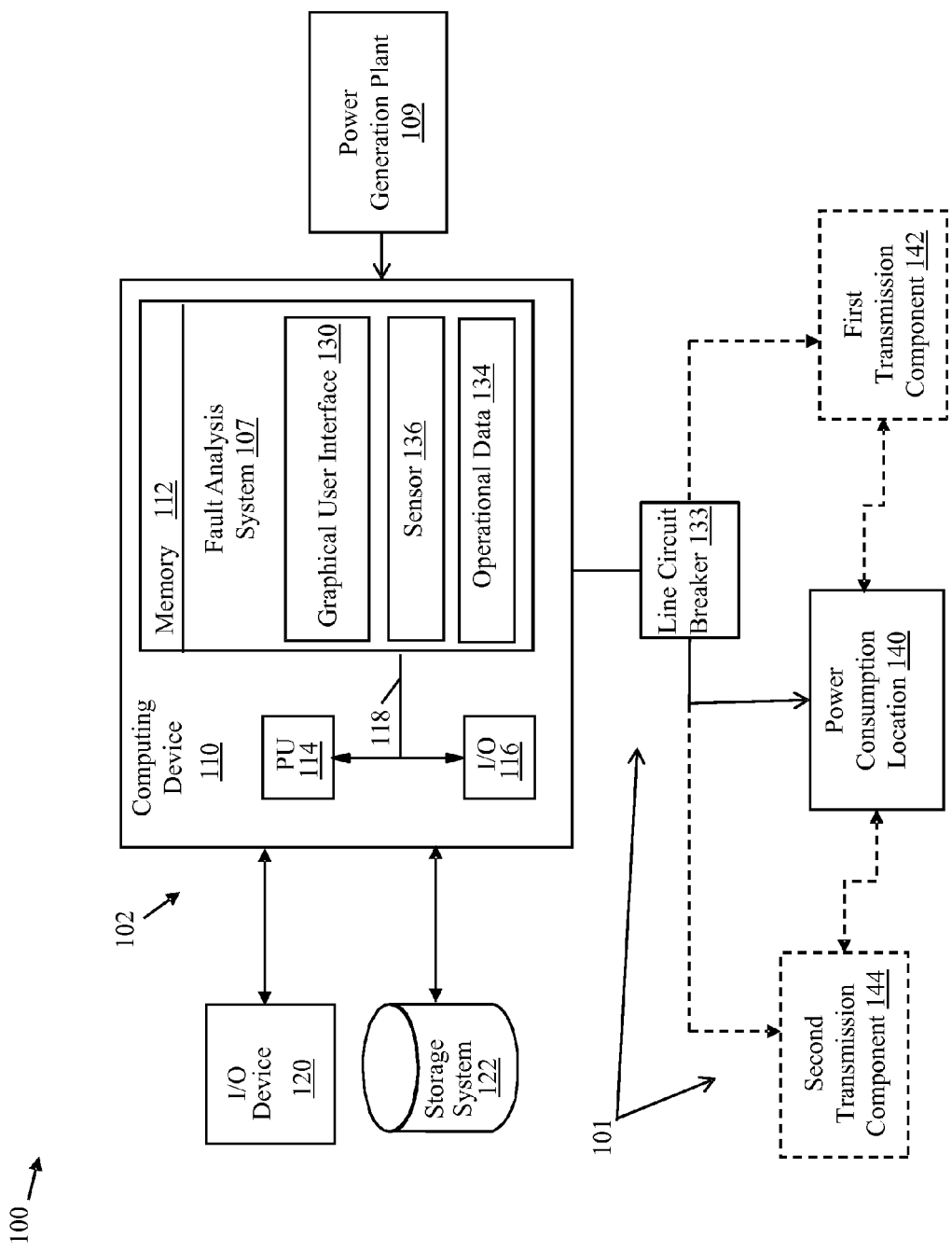
FIG. 1 shows a block diagram of a schematic illustration of an environment including a control system in accordance with an embodiment of the invention.

It is noted that the drawings of the disclosure may not necessarily be to scale. The drawings are intended to depict only typical aspects of the disclosure, and therefore should not be considered as limiting the scope of the disclosure. In the drawings, like numbering represents like elements between the drawings.

DETAILED DESCRIPTION OF THE INVENTION

As indicated herein, aspects of the invention provide for systems and methods configured to analyze and/or respond to faults (e.g., single phase faults) which occur during the operation of a power transmission system. These systems analyze operational data (e.g., circuit breaker status, voltage values, current values, etc.) obtained from components of the power transmission system, and, based upon this operational data, determine if a fault is occurring within the power transmission system and if so which kind of fault is occurring and when the associated arc will be extinguished. In response to this analysis, the system adaptively and timely responds to the fault (e.g., opens and closes a line circuit breaker in the power transmission system).

During operation of some power transmission systems, faults may occur which could potentially damage components, harm beings or disrupt service. Typically, power transmission systems include a system which monitors power transmission in the system to determine when a fault occurs. In response to detecting a fault, these fault detection systems may employ a fixed time interval reclosure method to treat the line (e.g., disconnect all loads from the line for a predetermined period of time, and then reconnect all loads to the line) until the arc extinguishes. However, this fixed time interval reclosure method may lead to unnecessarily long service outages or restriking of the arc, and thus may reduce the efficiency and reliability of the system.

In contrast to the conventional system, embodiments of the current invention provide for a system which analyzes operational data (e.g., circuit breaker status, voltage values, current values, waveforms, etc.) obtained from components of the power transmission system to develop and process a pattern of the faulty phase voltage. Based upon the analysis of this faulty phase voltage pattern, the invention determines if a fault is transient or permanent, and determines when the arc will be extinguished. In one embodiment, the system includes a computing device which is communicatively connected to a storage system and at least one sensor. The computing device is configured to obtain and process operational data from the at least one sensor to generate a faulty phase voltage pattern and identify whether the fault is temporary or permanent, whether the fault is a single, double or triple phase fault and when the associated arc will be extinguished. Once the fault has been identified, the computing device may recommend or take appropriate corrective action (e.g., an adaptive reclosing method for a single phase fault). The computing device may manipulate (e.g., opening and timely reclosing) a line circuit breaker for the single faulted phase, guiding adaptive operation of the power transmission system to efficiently manage the single phase fault and extinguish the arc in the most efficient way possible (e.g., reclosing the line circuit breaker as soon as the fault is extinguished).

As will be appreciated by one skilled in the art, the fault analysis system described herein may be embodied as a system(s), method(s), operator display(s) or computer program product(s), e.g., as part of a power plant system, a power generation system, a power transmission system, etc. Accordingly, embodiments of the present invention may take the form of an entirely hardware embodiment, an entirely software embodiment (including firmware, resident software, micro-code, etc.) or an embodiment combining software and hardware aspects that may all generally be referred to herein as a "circuit," "module," "network" or "system." Furthermore, the present invention may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, or device. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, or transport the program for use by or in connection with the instruction execution system, apparatus, or device. The computer-usable medium may include a propagated data signal with the computer-usable program code embodied therewith, either in baseband or as part of a carrier wave. The computer-usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flow diagram and/or block diagram block or blocks.

Turning to the FIGURES, embodiments of a system configured to analyze and/or adaptively respond to faults (e.g., single phase faults) in the operation of a power transmission system are shown. Each of the components in the FIGURES may be connected via hardwired, wireless, or other conventional means as is indicated in FIGS. 1-7. Specifically, referring to FIG. 1, an illustrative environment 100 including a fault analysis system 107 which monitors and/or adjusts operation of a power transmission system 101 (e.g. a three phase power transmission system) between a power generation plant 109 and a power consumption location 140 is shown according to embodiments of the invention. Environment 100 includes a computer infrastructure 102 that can perform the various processes described herein. In particular, computer infrastructure 102 is shown including computing device 110 which includes fault analysis system 107, which enables computing device 110 to adaptively detect, analyze, and/or manage faults in power transmission system 101 by performing the process steps of the disclosure.

As previously mentioned and discussed further below, fault analysis system 107 has the technical effect of enabling computing device 110 to perform, among other things, the adaptive fault response control operations described herein. It is understood that some of the various components shown in FIG. 1 can be implemented independently, combined, and/or stored in memory for one or more separate computing devices that are included in computing device 110. Further, it is understood that some of the components and/or functionality may not be implemented, or additional schemas and/or functionality may be included as part of fault analysis system 107.

Computing device 110 is shown including a memory 112, a processor unit (PU) 114, an input/output (I/O) interface 116, and a bus 118. Further, computing device 110 is shown in communication with an external I/O device/resource 120 and a storage system 122. As is known in the art, in general, PU 114 executes computer program code, such as fault analysis system 107, that is stored in memory 112 and/or storage system 122. While executing computer program code, PU 114 can read and/or write data, such as graphical user interface 130 and/or operational data 134 (e.g., circuit breaker status, voltage of transmission line at a local end, current values within power transmission system 101, voltage values within power transmission system 101, waveforms of power within power transmission system 101, etc.), to/from memory 112, storage system 122, and/or I/O interface 116. In one embodiment, operational data 134 may be obtained and/or processed in real time. Bus 118 provides a communications link between each of the components in computing device 110. I/O device 120 can comprise any device that enables a user to interact with computing device 110 or any device that enables computing device 110 to communicate with one or more other computing devices. Input/output devices (including but not limited to keyboards, displays, pointing devices, etc.) can be coupled to the system either directly or through intervening I/O controllers.

In some embodiments, as shown in FIG. 1, environment 100 and power transmission system 101 may optionally include a first transmission component 142 and a second transmission component 144 connected to power consumption location 140 and computing device 110. First transmission component 142 and second transmission component 144 may include any number of electrical components as is known, including a transmission line, a transformer, a circuit breaker, series compensation devices, a conductor, a relay, etc. In one embodiment, computing device 110 and/or fault analysis system 107 may be disposed within an existing transmission line protective device (e.g., a fault detection system, line reclosure system, etc.). In some embodiments, computing device 110 and/or fault analysis system 107 may be disposed upon or within power consumption location 140. In some embodiments, computing device 110 and/or fault analysis system 107 may be disposed upon or within power generation plant 109. It is understood that fault analysis system 107 is not limited to any particular kind of power transmission system and may be used to monitor and adjust operations of transposed transmission lines, untransposed transmission lines, transmission lines including a shunt reactor, transmission lines not including a shunt reactor, transmission lines with or without series compensation, fully or partially double circuit lines, or any other form of transmission lines now known or later developed. Further, fault analysis system 107 may be used by protective relays, intelligent electronic devices, controllers, circuit breakers or any other known transmission or computational devices.

In an embodiment of the invention, computing device 110 may process operational data 134 (e.g., circuit breaker status, voltage values, current values, etc.) as discussed herein, to monitor power transmission system 101. In one embodiment, computing device 110 may obtain operational data 134 from a sensor 136 connected to power transmission system 101. Sensor 136 is adapted to monitor electrical service flow through power transmission system 101. It is understood that sensor 136 may include any sensor or number of sensors now known or later developed, including a current transformer, a capacitive coupling voltage transformer, etc.

In one embodiment, computing device 110 may determine a fault has occurred in power transmission system 101 by analyzing a waveform and/or identifying a deviation in values for operational data 134 (e.g., a variation in voltage magnitude for a phase of the service flow, a variation in phase angle $\delta$ for a phase of the service flow, etc.). In one embodiment, computing device 110 may monitor all three phases of power transmission system 101. In one embodiment, computing device 110 may individually monitor each phase by establishing a set of baseline values for each phase based on previously obtained operational data 134, and then monitoring each phase to determine if real time/current operational data 134 values deviate from these baseline values (as shown graphically in FIGS. 5-7). In one embodiment, in response to determining that a fault has occurred within power transmission system 101, computing device 110 may trip a line circuit breaker 133 associated with the faulted phase(s). Line circuit breaker 133 is adapted to disconnect a flow of service through power transmission system 101. Computing device 110 processes operational data 134 to determine whether the fault was transient or permanent; single, double, or triple phase; and if/when the arc will extinguish, and then may accordingly trip line circuit breakers for the remaining phases. In one embodiment, computing device 110 may make these determinations in real time. In one embodiment, if computing device 110 determines that a permanent fault (FIG. 5) has occurred, then computing device 110 ceases any reclosure efforts and leaves line circuit breaker 133 open. In one embodiment, if computing device 110 determines that a transient fault (FIGS. 6 and 7) has occurred, then computing device 110 may begin processing operational data 134 to determine when the arc is/will be extinguished. In one embodiment, computing device 110 may determine if the arc has been extinguished in real time. In one embodiment, once computing device 110 determines that the arc has been extinguished, reclosure methods may be initiated to close the line circuit breakers including line circuit breaker 133. These reclosure methods reestablish transmission of power/service flow through power transmission system 101.

In any event, computing device 110 can comprise any general purpose computing article of manufacture capable of executing computer program code installed by a user (e.g., a personal computer, server, handheld device, etc.). However, it is understood that computing device 110 is only representative of various possible equivalent computing devices that may perform the various process steps of the disclosure. To this extent, in other embodiments, computing device 110 can comprise any specific purpose computing article of manufacture comprising hardware and/or computer program code for performing specific functions, any computing article of manufacture that comprises a combination of specific purpose and general purpose hardware/software, or the like. In each case, the program code and hardware can be created using standard programming and engineering techniques, respectively. In one embodiment, computing device 110 may be/include a distributed control system. In another embodiment, computing device 110 may be integral to a power transmission system 101. In another embodiment, computing device 110 may be integral to power generation plant 109. In another embodiment, computing device 110 may be a part of power consumption location 140.

Figure 2:
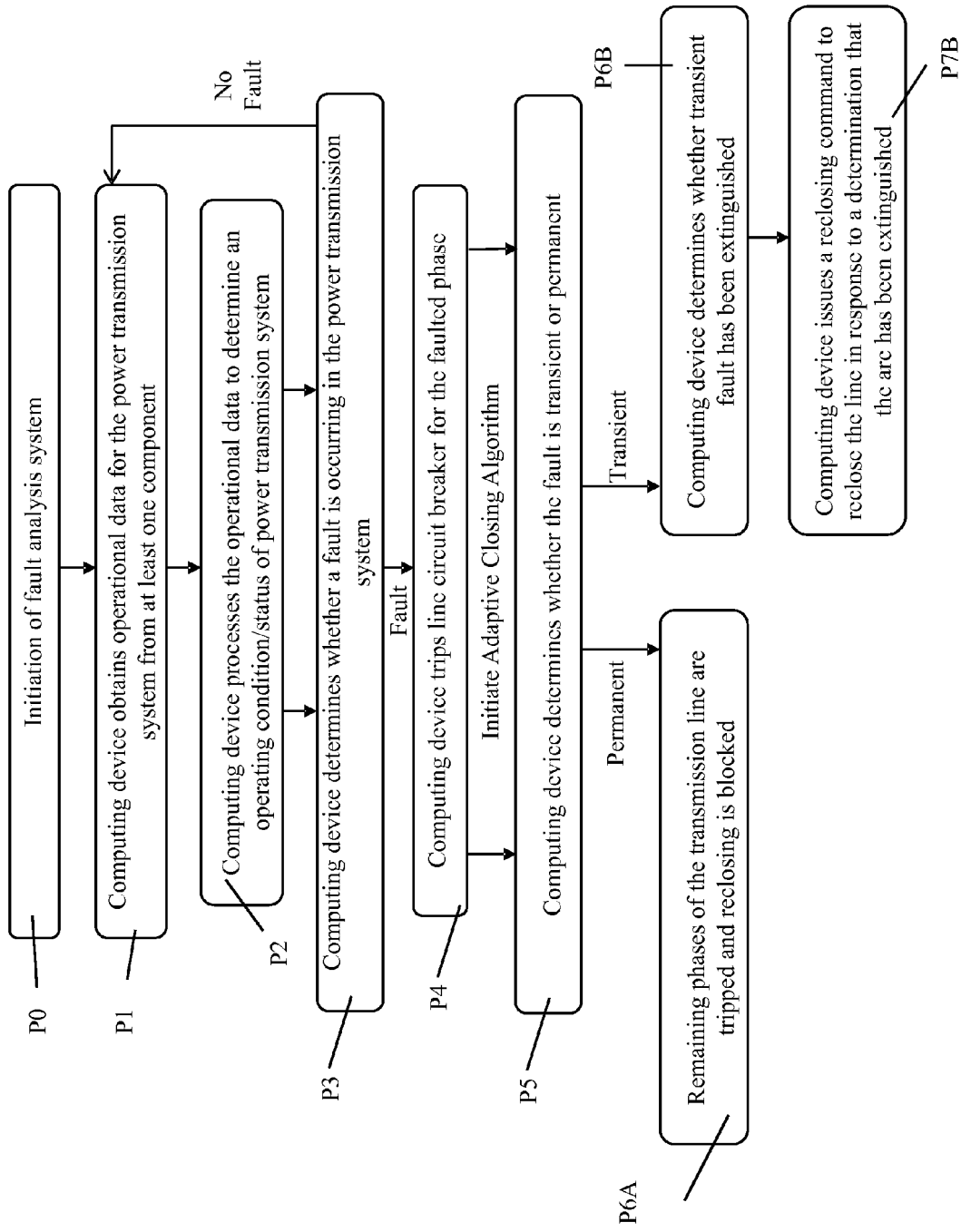
FIG. 2 shows a method flow diagram illustrating a process according to embodiments of the invention.

Turning to FIG. 2, an illustrative method flow diagram is shown according to embodiments of the invention In pre-process P0, fault analysis system 107 is initiated on computing device 110 to begin fault monitoring of power transmission system 101. Following pre-process P0, in process P1, computing device 110 obtains operational data for at least one component of power transmission system 101. Operational data 134 may be obtained from at least one of: sensor 136, memory 112, storage system 122, first transmission component 142, second transmission component 144, a transmission line local end, etc. Operational data 134 may include: circuit breaker status, measured voltage values of a transmission line local end, current values within power transmission system 101, voltage values within power transmission system 101, waveforms of power within power transmission system 101, etc.

Following process P1, in process P2, computing device 110 processes operational data 134 to determine an operating condition/status of power transmission system 101 based upon the operational data 134 obtained from power transmission system 101, first transmission component 142, and/or second transmission component 144. In one embodiment, computing device 110 may connect with memory 112 and/or storage system 122 to access reference data (e.g., a look-up table, a pre-generated curve, design specifications for power transmission system 101, etc.) and compare/contrast the operational data 134 with the reference data. In one embodiment, fault analysis system 107 may cause computing device 110 to be adaptive to the specifications of power transmission system 101 and/or operational conditions of and about power transmission system 101 when processing operational data 134. Computing device 110 may factor variables (e.g., air temperature, power demands, system capacity, system specifications, etc.) in analyzing operational data 134. In one embodiment, computing device 110 may process a set of measured voltage values for a local end of the transmission line. In another embodiment, computing device 110 may process operational data 134 independent of power transmission system 101 variations or operating conditions.

In any event, following the processing of process P2, in process P3, computing device 110 determines whether a fault is occurring within power transmission system 101. In one embodiment, computing device 110 may determine whether a fault is occurring by analyzing voltage values within the three phases of power transmission system 101. In another embodiment, computing device 110 may determine whether a fault is occurring by analyzing current values within the three phases of power transmission system 101. In one embodiment, computing device 110 may determine whether a fault is occurring by analyzing three phase voltage measurements of power transmission system 101 obtained from a local end. In one embodiment, computing device 110 may determine an operational state of power transmission system 101 based solely on the three phase voltage measurement at the local end. In another embodiment, computing device 110 may determine whether a fault is occurring by comparing and/or contrasting values obtained for the three phases of power transmission system 101.

In any event, if in process P3, computing device 110 determines that no fault is occurring in power transmission system 101, then computing device 110 and fault analysis system 107 return to process P1 to obtain a new set of operational data 134 for power transmission system 101. Alternatively, if in process P3, computing device 110 determines that a fault is occurring in power transmission system 101, then, in process P4, computing device 110 opens/trips line circuit breaker 133 for the faulted phase(s). In one embodiment, shown in FIG. 3, in response to tripping line circuit breaker 133, computing device 110 may analyze the detected fault by processing operational data 134 using an adaptive reclosing algorithm and a set of filters.

Figure 3:
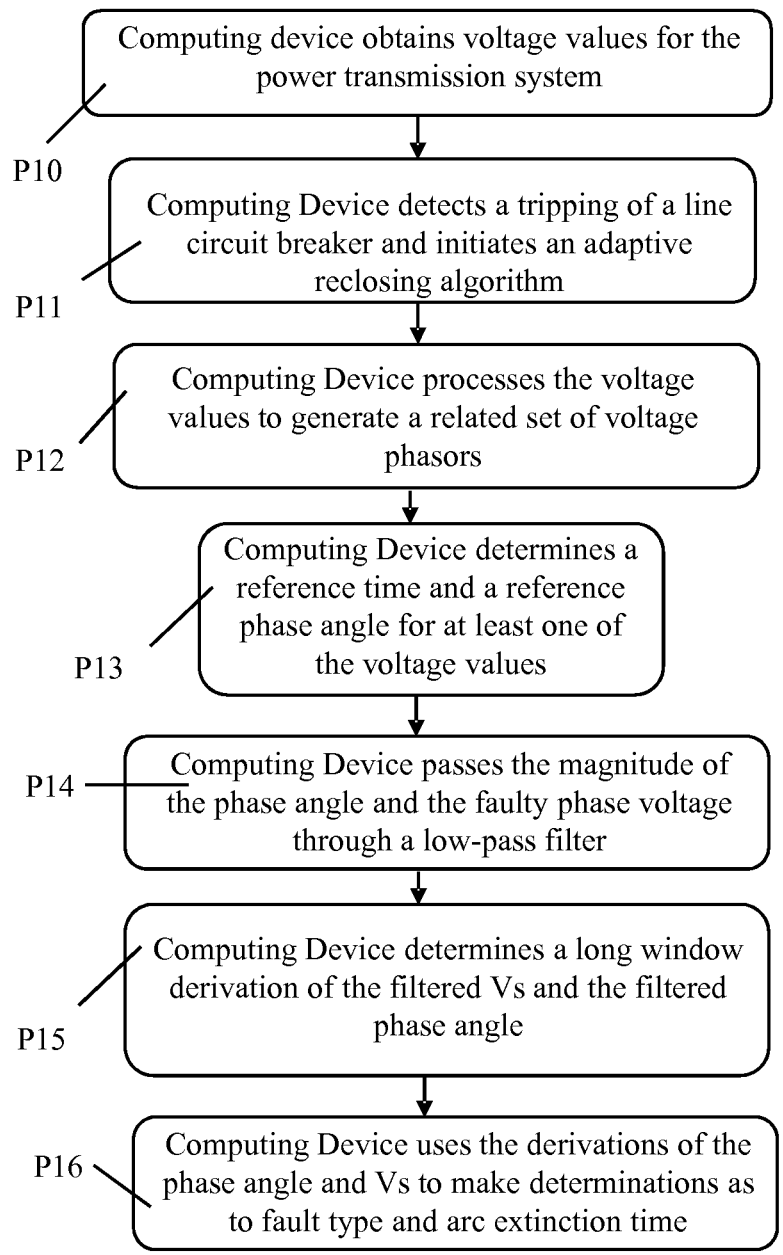
FIG. 3 shows a method flow diagram illustrating a process according to embodiments of the invention.

Turning to FIG. 3, an illustrative method flow diagram is shown according to embodiments of the invention. In pre-process P10, voltage values (e.g., $E_h$, $E_k$, $E_s$ etc.) are obtained for a set of phases H, K, and S of power transmission system 101. In one embodiment, these voltage values may be obtained at a local end of the transmission lines. Following pre-process P10, in process P11, in response to detection of a tripping of line circuit breaker 133, computing device 110 initiates an adaptive reclosing algorithm to process and/or analyze the voltage values. In one embodiment, initiation of the adaptive reclosing algorithm occurs after line circuit breaker 133 experiences interruption and line isolation. In one embodiment, line circuit breaker 133 isolation may be detected via monitoring of the faulted phase current. In another embodiment, line circuit breaker 133 isolation may be detected via monitoring of the status of line circuit breaker 133 (e.g., open, close, etc.). In one embodiment, initiation of the adaptive reclosing algorithm occurs when the transients in the voltage magnitude and phase angle are damped in response to line circuit breaker 133 isolation. Following process P11, in process P12, computing device 110 processes the voltage values to generate a set of voltage phasors (e.g., $V_h$, $V_k$, $V_s$, etc.). Voltage of the faulty phase S at the line end may be represented by $V_s$; metered voltage of the healthy phase H may be represented by $V_h$; and metered voltage of the healthy phase K may be represented by $V_k$. In one embodiment, computing device 110 passes the voltage values through a set of filters including at least one of: an anti-aliasing filter, a Capacitor Coupling Voltage Transformer (CCVT) transient filter, and a Phasor estimation to generate the set of voltage phasors (e.g., $V_h$, $V_k$, $V_s$, etc.). Following process P12, in process P13, computing device 110 determines a reference time and a reference phase angle (δ) for at least one of the voltage values. In one embodiment, the phase angle may be determined via Equation (1) below:

$$\delta = \angle(V_h + V_k) - \angle V_s \text{(in degree)} \qquad (1)$$

Figure 6:
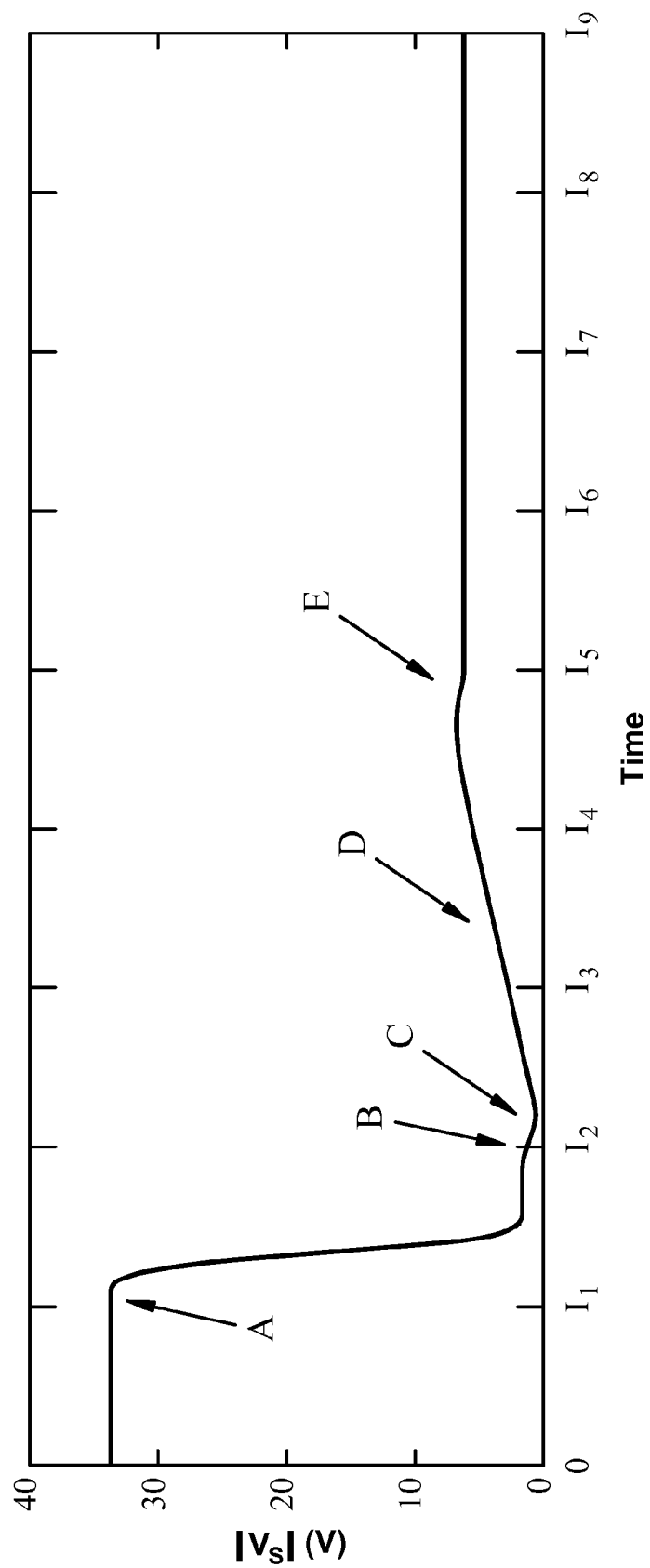
FIG. 6 shows a schematic view of portions of fault waveforms in accordance with an aspect of the invention.
Figure 7:
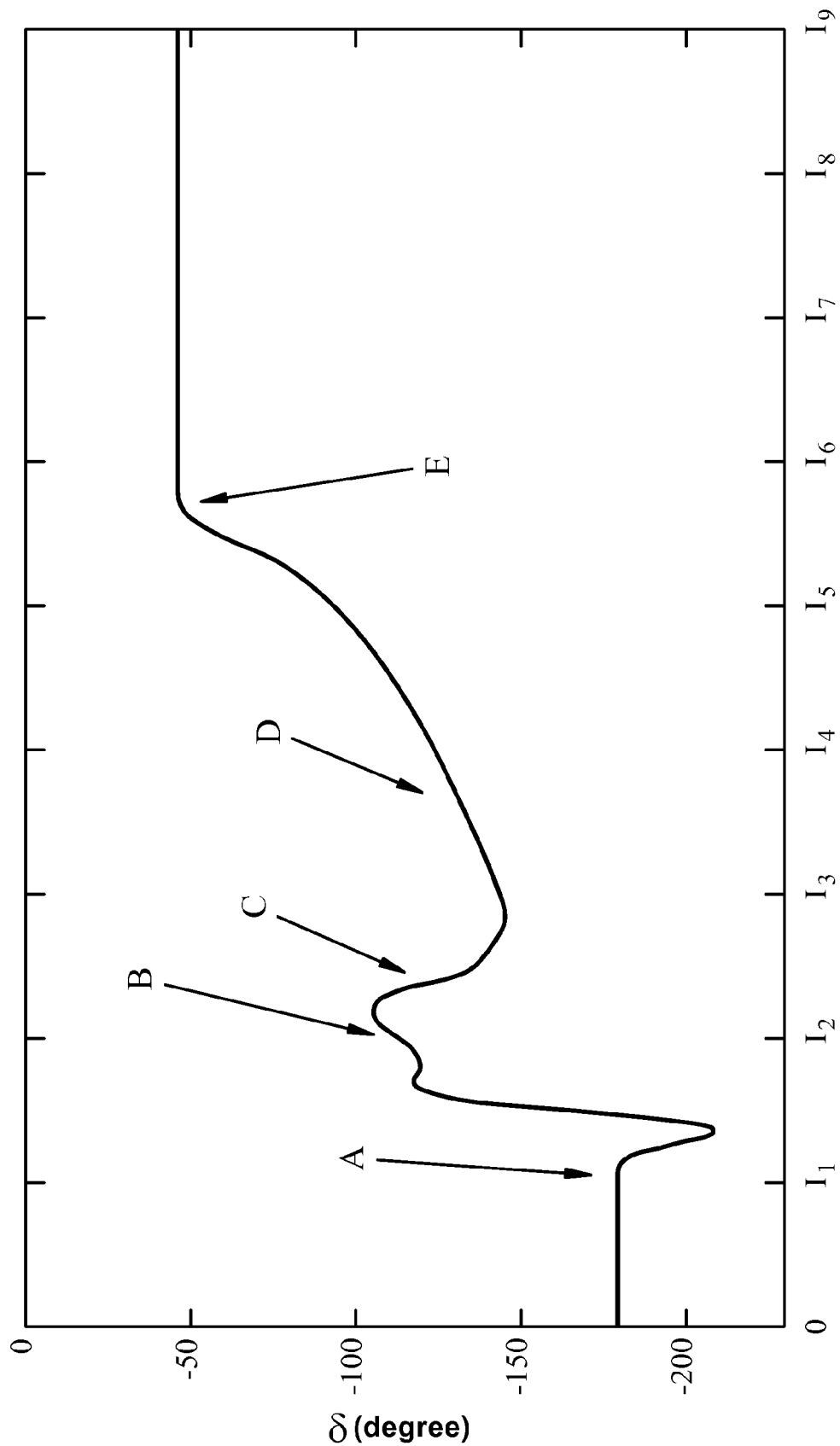
FIG. 7 shows a schematic view of portions of fault waveforms in accordance with an aspect of the invention.

In one embodiment, the reference time is the moment in which the magnitude of the faulted phase voltage increases following the voltage drop which occurs as a result of the line isolation created by the fault detection operation and circuit breaker interruption (see FIGS. 6 and 7). In one embodiment, computing device 110 may monitor a magnitude of faulty phase voltage $V_s$ to determine the reference time. In one embodiment, the reference time is determined based on the magnitude of the faulty phase voltage. This can be determined by calculating the minimum faulted phase voltage magnitude after the algorithm has been initiated and comparing it with the real time faulted phase voltage magnitude. In one embodiment, when the magnitude of the faulty phase voltage remains above the minimum faulted phase voltage magnitude for about one power system cycle, the current time of calculation is recorded as the reference time. In one embodiment, the phase angle δ calculated at the reference time is recorded as the reference angle δ. In one embodiment, computing device 110 determines the voltage value of the faulty phase $V_s$. In one embodiment, phase angle δ may be compensated by ±360°. Following process P13, in process P14, computing device 110 passes a magnitude of the faulty phase voltage and the reference phase angle (δ) through a low-pass filter.

In one embodiment, the low-pass filter attenuates unwanted transients in either or both of the magnitude of the faulty phase voltage and the phase angle δ. In one embodiment, the low-pass filter attenuates unwanted transients above about 15 Hz. Following process P14, in process P15, computing device 110 determines a long-window derivation of the filtered V, and the filtered phase angle by fitting a line to the data set (e.g., FIGS. 5-7). In one embodiment, the line is fit using the least squares method. In one embodiment, the line is fit to about the last 6 cycles of data. Following process P15, in process P16, the derivations of the phase angle δ and $V_s$ are used by computing device 110 to make determinations as to fault type and arc extinction time, as shown in FIG. 2.

Returning to FIG. 2, and following process P4, in process P5, computing device 110 determines whether the fault is transient or permanent. In one embodiment, computing device 110 begins the process of determining if the fault is transient or permanent in less than two cycles. In one embodiment, computing device 110 determines whether the fault is transient or permanent based on the voltage pattern of the faulted line phase. In one embodiment, computing device 110 compares the voltage pattern of the faulted line phase to the voltage patterns of the remaining two healthy line phases. The adaptive algorithm may use voltage phasors provided by available phasor estimation with the CVT transient filter in the line protection relays (see FIG. 3).

In one embodiment, computing device 110 may determine a fault is permanent when the voltage magnitude and phase angle of the faulted phase remain about constant (e.g., FIG. 5) after line isolation (e.g., line circuit breaker 133 is opened). In one embodiment, computing device 110 may determine that a fault is transient when the voltage magnitude drops immediately after line circuit breaker 133 is tripped and then slowly increases until the time that the arc is extinguished (e.g., FIGS. 6 and 7). In one embodiment, computing device 110 may determine that a fault is transient when, after the line circuit breaker 133 is opened/tripped, the voltage angle either drops immediately and then slowly increases until the time that the arc is extinguished or slowly increases until the time that the arc is extinguished (e.g., FIGS. 6 and 7). In one embodiment, computing device 110 may determine that a fault is extinguished when the magnitude of the voltage of the faulty phase either becomes constant followed by a small drop or becomes oscillatory with a constant DC component which is several degrees larger than the reference angle (e.g., about 30 degrees larger than the reference angle). In one embodiment, computing device 110 may determine that a fault is extinguished when the angle becomes constant or oscillatory with a constant DC component which is several degrees larger than the reference angle (e.g., FIGS. 6 and 7).

Following process P5, in process P6A, if computing device 110 and fault analysis system 107 determine that a permanent fault has occurred, then the other two phases of the transmission line are tripped and reclosing procedures are blocked. Alternatively, in process P6B, if computing device 110 and fault analysis system 107 determine that a transient fault has occurred, then computing device 110 determines whether the arc of the transient fault has been extinguished. In one embodiment, computing device 110 may determine that the arc is transient when the voltage magnitude drops immediately after line circuit breaker 133 is tripped and then slowly increases until the time that the arc is extinguished. In one embodiment, computing device 110 may determine that the arc is transient when, after the line circuit breaker 133 is tripped, the voltage angle either drops immediately and then slowly increases until the time that the arc is extinguished, or slowly increases until the time that the arc is extinguished. In one embodiment, computing device 110 may determine that the arc of a transient fault is extinguished when the magnitude of the voltage of the faulted phase either becomes constant followed by a small drop or becomes oscillatory with a constant DC component which is several degrees larger than the reference angle. In one embodiment, computing device 110 may determine that the arc of a transient fault is extinguished when the angle becomes constant or oscillatory with a constant DC component which is several degrees larger than the reference angle.

In any event, following process P6B, once computing device 110 determines that the arc has been extinguished and/or determines a time that the arc will extinguish, in process P7B, computing device 110 determines an appropriate response to the fault condition. In one embodiment, computing device 110 issues a reclosing command to reclose the line circuit breaker 133 in response to a determination that the arc has been extinguished. In one embodiment, computing device 110 may automatically reclose line circuit breaker 133. In any event, following a single phase to ground fault, computing device 110 and fault analysis system 107 may reclose line circuit breaker 133 in real time, once the arc has been extinguished.

The data flow diagram and block diagrams in the FIGURES illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the FIGURES. For example, two blocks shown in succession may, in fact, be executed substantially concurrently, or the blocks may sometimes be executed in the reverse order, depending upon the functionality involved. It will also be noted that each block of the block diagrams and/or flow diagram illustrations, and combinations of blocks in the block diagrams and/or flow diagram illustrations, can be implemented by special purpose hardware-based systems that perform the specified functions or acts, or combinations of special purpose hardware and computer instructions.

Figure 4:
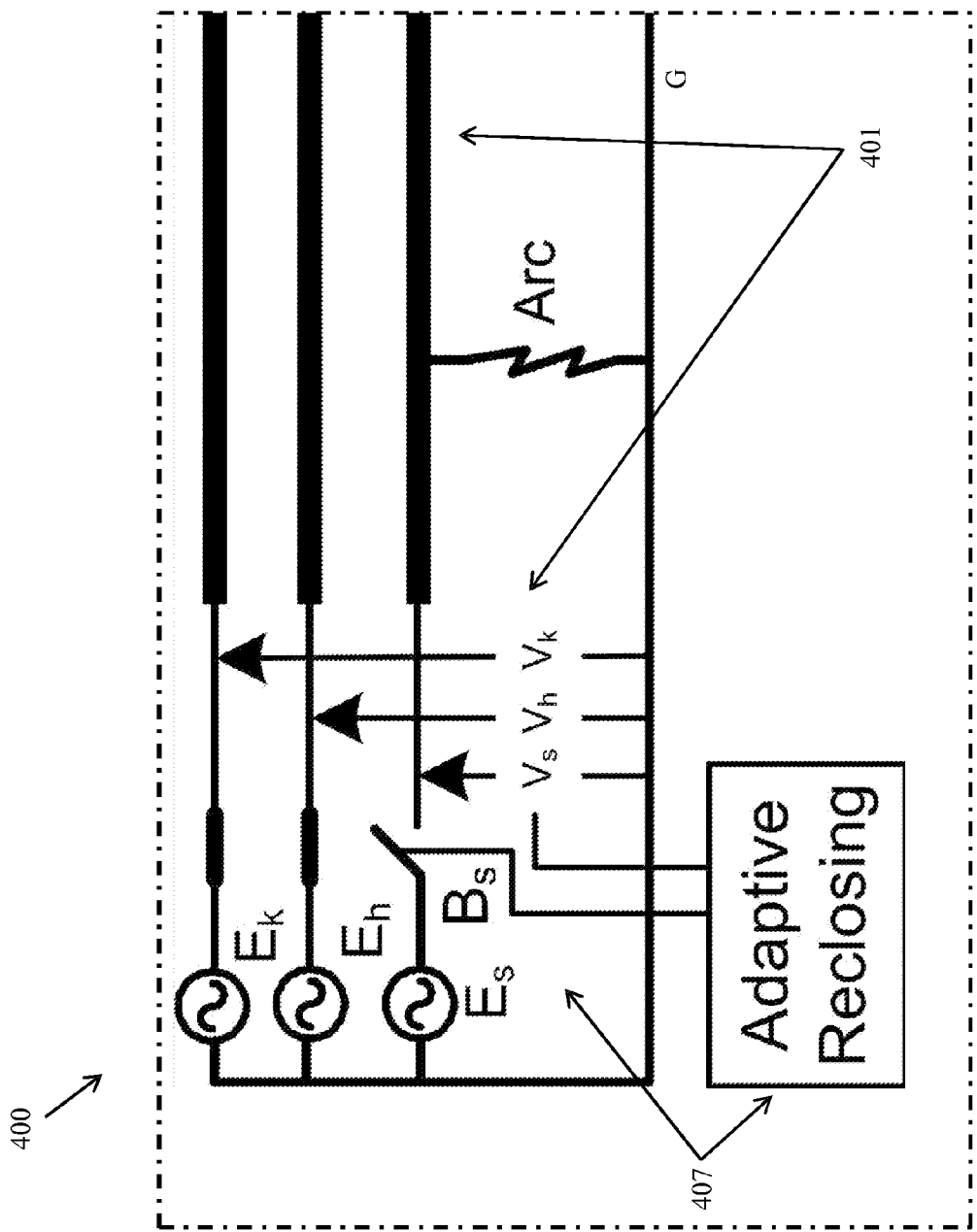
FIG. 4 shows a schematic illustration of an environment according to embodiments of the invention.

Turning to FIG. 4, a schematic illustration of an environment 400, including a power transmission system 401 which includes a fault analysis system 407, and three phases K, H, and S, is shown according to embodiments of the invention. In this embodiment, a single phase fault to ground (G) is shown by Arc. Power transmission system 401 is a three phase system where $E_k$, $E_h$, and $E_s$ represent operational values for each of the three phases. In this embodiment, a line circuit breaker ($B_s$) has been tripped by fault analysis system 407 in response to a detection of Arc. Fault analysis system 407 processes the measured voltages at the line end for each of the three phases to determine the response/reclosing time of line circuit breaker ($B_s$). In one embodiment, fault analysis system 407 compares the magnitude of the measured voltage of $V_s$ (the faulted phase) and the phase angle δ of the measured voltage of $V_s$ to the measured voltages $V_h$ and $V_k$, the non-faulted/remaining phases, to determine the appropriate timing and action for $B_s$ reclosing.

Figure 5:
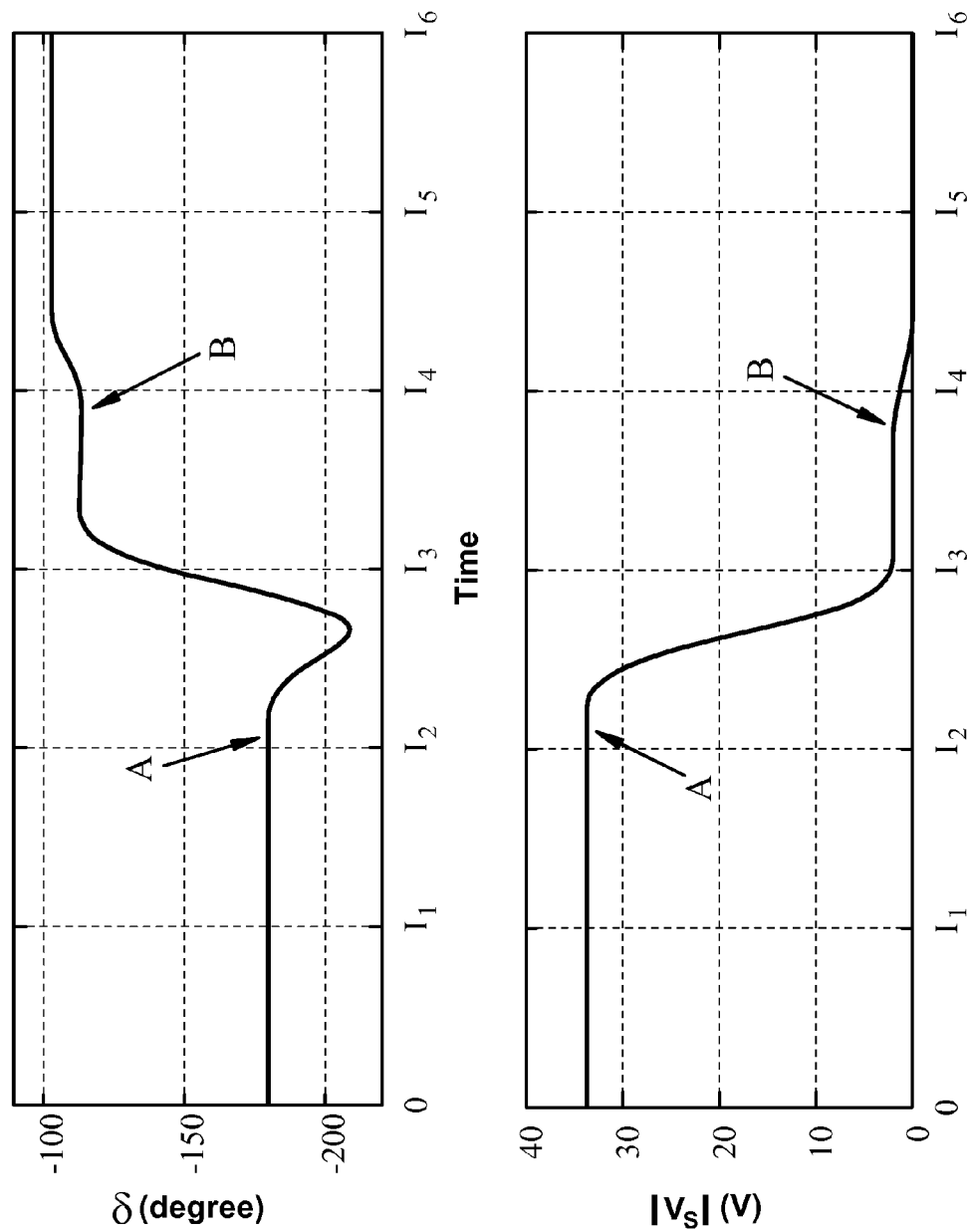
FIG. 5 shows a schematic view of portions of fault waveforms in accordance with an aspect of the invention.

Turning to FIGS. 5-7, schematic illustration of exemplary sets of fault waveform data points plotted over a set of time intervals ($I_1 \ldots I_n$) are shown according to embodiments of the invention. In FIG. 5, values for the faulted phase voltage magnitude and phase angle δ of a transmission component during a permanent fault event are shown with respect to time between interval $I_1$ and $I_6$, according to embodiments of the invention. The values of both the phase voltage magnitude and angle δ are substantially constant prior to the fault event represented at point A. Following point A, the voltage magnitude decreases until line circuit breaker 133 is opened/tripped and the faulted phase is isolated at point B. Comparatively, between the fault event at point A and fault phase isolation at point B, the phase angle δ increases. Following the fault phase isolation at point B, the voltage magnitude $V_s$ approaches zero and the phase angle δ remains constant, thus both indicating a permanent fault. Turning to FIG. 6, a set of values for the faulted phase voltage magnitude $V_s$ during a transient fault event are shown with respect to time between interval $I_1$ and $I_9$, according to embodiments of the invention. In FIG. 6, the voltage magnitude V, is substantially constant prior to the fault event at point A; following the fault event, the voltage magnitude $V_s$ decreases and then levels prior to the faulted line isolation are represented at point B. Following the faulted line isolation at point B, there is a further voltage magnitude $V_s$ drop to point C at about zero, and the voltage magnitude then begins to increase through point D until arc extinction at point E. The voltage pattern of FIG. 6 is indicative of a transient fault as indicated by the voltage magnitude $V_s$ immediately dropping and then slowly increasing until point E, and/or by the voltage magnitude $V_s$ slowly increasing following the line isolation at point B. Turning to FIG. 7, a set of values for the faulted phase angle δ during a transient fault event are shown with respect to time, according to embodiments of the invention. In FIG. 7, the phase angle δ is substantially constant prior to the fault event at point A. Following the fault event, the phase angle δ initially decreases then increases until faulted line isolation is reached at point B. Following point B, the phase angle δ again drops through point C and then begins to increase through point D until arc extinction at point E. In one embodiment, the pattern of FIG. 7 is indicative of a transient fault as indicated by the phase angle δ immediately dropping and then slowly increasing until point B, and/or by the phase angle δ slowly increasing following the line isolation at point B.

The fault analysis system of the present disclosure is not limited to any one power generation system, power transmission system, or other system, and may be used with other power systems. Additionally, the system of the present invention may be used with other systems not described herein that may benefit from the fault detection and response provided by the fault analysis system described herein.

As discussed herein, various systems and components are described as "obtaining" and/or "transferring" data (e.g., operational data, system specifications, etc.). It is understood that the corresponding data can be obtained using any solution. For example, the corresponding system/component can generate and/or be used to generate the data, retrieve the data from one or more data stores or sensors (e.g., a database), receive the data from another system/component, and/or the like. When the data is not generated by the particular system/component, it is understood that another system/component can be implemented apart from the system/component shown, which generates the data and provides it to the system/component and/or stores the data for access by the system/component.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A system, comprising:
   at least one computing device adapted to monitor operation of a power transmission system by performing actions comprising:
   processing operational data from a set of line phases in the power transmission system to detect a faulted line phase;
   opening a circuit breaker for the faulted line phase in response to detecting the fault;
   determining whether a fault is transient or permanent, wherein the determining whether the fault is transient or permanent includes analyzing a phase angle of the line faulted phase; and
   determining if an arc associated with the fault has been extinguished.

2. The system of claim 1, wherein the determining whether the fault is transient or permanent includes analyzing a voltage pattern of the line faulted phase.

3. The system of claim 1, wherein the at least one computing device is further adapted to reclose the circuit breaker for the line faulted phase in response to a determination that the arc has been extinguished.

4. The system of claim 1, wherein the determining if the arc associated with the fault has been extinguished includes analyzing a voltage pattern of the line faulted phase.

5. The system of claim 1, wherein the determining whether the fault is transient or permanent is based on a three phase voltage measurement at a local end of the power transmission system.

6. The system of claim 1, wherein the at least one computing device is further adapted to trip a set of circuit breakers for each phase in the set of phases in response to a determination that the fault is permanent.

7. A method, comprising:
   processing, on the computing device, operational data from a set of line phases in the power transmission system to detect a faulted line phase;
   opening, via the computing device, a circuit breaker for the faulted line phase in response to detecting a fault;
   determining, on the computing device, whether the fault is transient or permanent, wherein the determining whether the fault is transient or permanent includes analyzing a phase angle of the line faulted phase;

determining, on the computing device, if an arc associated with the fault has been extinguished, and reclosing, via the computing device, the circuit breaker in response to a determination that the arc has been extinguished.

8. The method of claim 7, wherein the analysis of operational data includes processing a set of voltage values for the at least one component.

9. The method of claim 7, wherein the determining whether the fault is transient or permanent includes analyzing a voltage pattern of the line faulted phase.

10. The method of claim 7, wherein the determining whether the detected fault is transient or permanent includes:

opening a set of breakers for remaining phases in the set of phases; and blocking reclosing of the set of circuit breakers in response to a determination that the detected fault is permanent.

11. The method of claim 7, wherein the determining whether the detected fault is transient or permanent includes analyzing a voltage pattern of the line faulted phase.

12. The method of claim 7, wherein the determining whether the arc has been extinguished includes reclosing the circuit breaker for the line faulted phase in response to a determination that the arc has been extinguished.

13. A power transmission system, comprising:

a power generation plant;

a set of transmission lines operatively connected to the power generation plant and adapted to transmit electricity via a set of line phases; and processing operational data from a set of line phases in the power transmission system to detect a faulted line phase;

opening a circuit breaker for the faulted line phase in response to detecting a fault;

determining whether the fault is transient or permanent, wherein the determining whether the fault is transient or permanent includes analyzing a phase angle of the line faulted phase;

determining if an arc associated with the fault has been extinguished; and reclosing the circuit breaker in response to a determination that the arc has been extinguished.

14. The power transmission system of claim 13, wherein the determining whether the fault is transient or permanent includes analyzing a voltage pattern of the line faulted phase.

15. The power transmission system of claim 13, wherein the at least one computing device is further adapted to reclose the circuit breaker for the line faulted phase in response to a determination that the arc has been extinguished.

16. The power transmission system of claim 13, wherein the determining if the arc associated with the fault has been extinguished includes analyzing a voltage pattern of the faulted phase.

17. The power transmission system of claim 13, wherein the output model comprises an instruction that at least one output be impacted while at least one other output be maintained.

* * * * *